United States Patent [19]
Nogami et al.

[11] Patent Number: 5,405,792
[45] Date of Patent: * Apr. 11, 1995

[54] METHOD OF MANUFACTURING SCHOTTKY BARRIER GATE TYPE FET

[75] Inventors: Takeshi Nogami, Tokyo; Hiroshi Iwasaki, Chigasaki, both of Japan

[73] Assignee: Kabushiki Kaisha Toshiba, Kawasaki, Japan

[ * ] Notice: The portion of the term of this patent subsequent to Sep. 1, 2009 has been disclaimed.

[21] Appl. No.: 941,151

[22] Filed: Sep. 4, 1992

Related U.S. Application Data

[60] Division of Ser. No. 688,711, Apr. 23, 1991, Pat. No. 5,187,111, which is a continuation of Ser. No. 393,820, Aug. 15, 1989, which is a continuation of Ser. No. 267,734, Nov. 3, 1988, which is a continuation of Ser. No. 911,905, Sep. 26, 1986.

[30] Foreign Application Priority Data

Sep. 27, 1985 [JP] Japan .................. 60-212201
Aug. 25, 1986 [JP] Japan .................. 61-197358

[51] Int. Cl.$^6$ .................. H01L 21/306; H01L 21/44
[52] U.S. Cl. .................. 437/39; 437/41; 437/174; 437/175; 437/177; 437/184; 437/192; 437/247; 437/912
[58] Field of Search .................. 437/39, 40, 41, 175, 437/176, 177, 184, 192, 245, 246, 247, 912; 148/DIG. 105, DIG. 140, DIG. 142

[56] References Cited

U.S. PATENT DOCUMENTS 4,330,343 5/1982 Christou et al. .
4,546,540 10/1985 Ueyanagi et al. .
4,581,076 4/1986 Badawi .................. 437/41

(List continued on next page.)

FOREIGN PATENT DOCUMENTS 0213919 3/1987 European Pat. Off. .
64-25528 1/1989 Japan .

OTHER PUBLICATIONS

Onodera et al., "A High-Transconductance Self-Aligned GaAs MESFET Fabricated by Through-AlN Implantation," IEEE Transactions on Electron Devices, vol. ED-31, No. 12, pp. 1808–1813, Dec. 1984.

(List continued on next page.)

*Primary Examiner*—Olik Chaudhuri
*Assistant Examiner*—Brian K. Dutton
*Attorney, Agent, or Firm*—Finnegan, Henderson Farabow, Garrett & Dunner

[57] ABSTRACT

The method of manufacturing the SB FET according to the present invention includes a first step of forming a refractory metal film on a semiconductor substrate, a second step of forming a first ion-implanted region within the semiconductor substrate, by an ion implantation process, a third step, independent of the second step, of forming second and third ion implantation regions in the semiconductor substrate by an ion implantation process during which impurity ions pass through the first film, with the second and third ion implantation regions being adjacent to the first ion implanted region. A fourth step of forming a channel region, source region and drain region by annealing to activate said first, second, and third ion implanted regions using the first film as a protective film, and bringing the first film in Schottky contact with the channel region, a fifth step of forming a Schottky gate electrode in Schottky contact with the channel region by patterning the first film after the channel, source and drain regions have been formed, with the first film being selectively maintained to prevent exposure of the channel region underlying the Schottky gate electrode, and a sixth step of forming a second film made of a refractory metal or a refractory metal compound on the first film forming a portion of said Schottky gate electrode.

14 Claims, 8 Drawing Sheets

U.S. PATENT DOCUMENTS

| | | | |
|---|---|---|---|
| 4,601,095 | 7/1986 | Kikuchi et al. | 437/18 |
| 4,636,822 | 1/1987 | Codella et al. | 357/22 |
| 4,642,879 | 2/1987 | Kawata et al. | |
| 4,729,966 | 3/1988 | Koshino et al. | 437/39 |
| 4,735,913 | 4/1988 | Hayes | |
| 4,929,567 | 5/1990 | Park et al. | |
| 5,143,856 | 9/1992 | Iwasaki | 437/39 |
| 5,187,111 | 2/1993 | Nogami et al. | 437/41 |

OTHER PUBLICATIONS

Katsuhara, "Analysis of Implantation Through Insulating Film/GaAs by Boltzmann Transport Equation," Applied Physics Institute, Academic Written Lecture, Spring 1985, 30a-X-s; NEC; Apr. 1985.

Japanese Patent Disclosure (KOKAI) No. 61-42963 filed Aug. 6, 1984; Disclosed Mar. 1, 1986, Inventors: M. Kanamori et al., "Method of Producing Semiconductor Device".

Gallium Arsenide Materials, Devices, and Circuits 216 (M. J. Howes and D. V. Morgan, eds., 1985).

H. M. Levy et al., "Self-Aligned Submicron Gate Digital GaAs Integrated Circuits" IEEE Electron Device Letters, vol. EDL-4, No. 4, Apr., 1983.

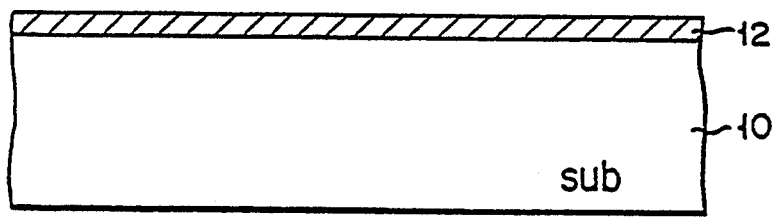
F I G. 1A
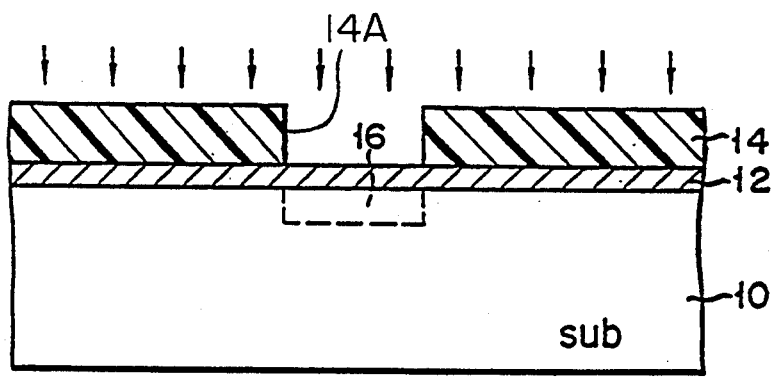
F I G. 1B
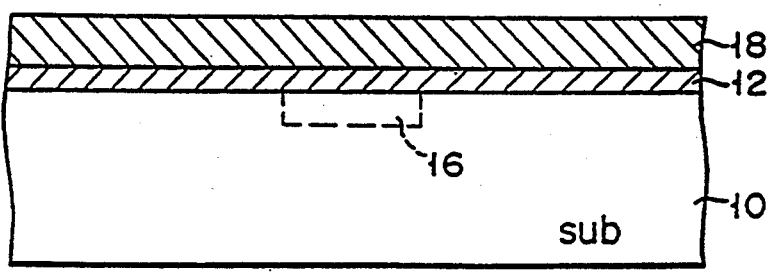
F I G. 1C
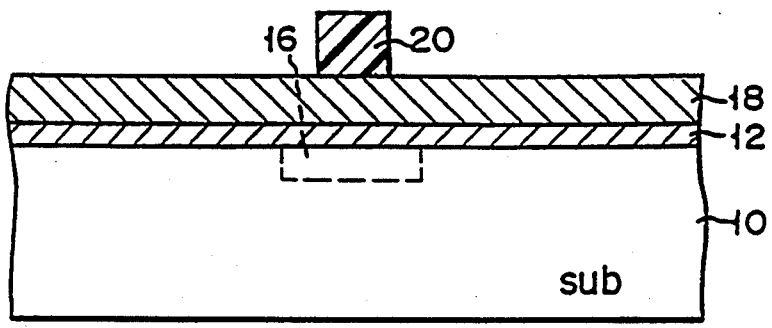
F I G. 1D

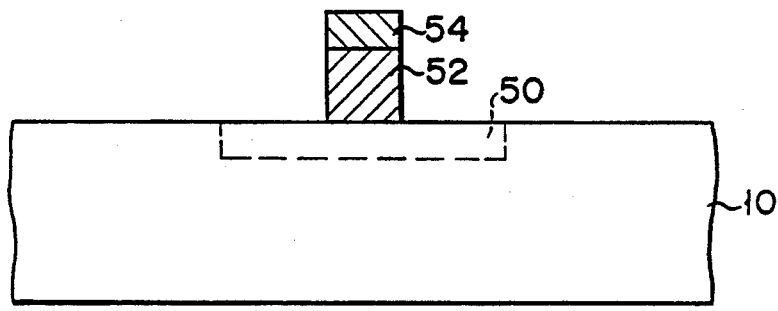
F I G. 5A
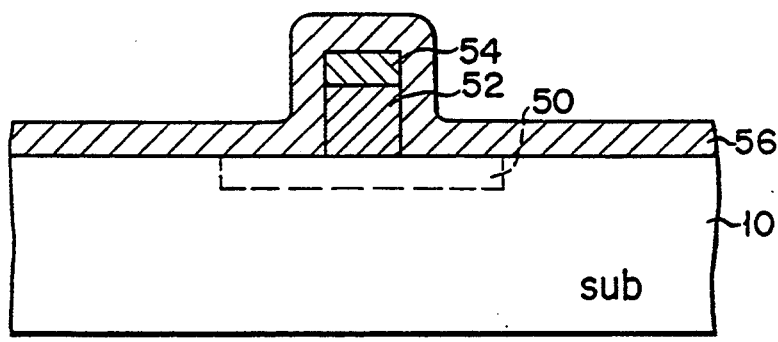
F I G. 5B
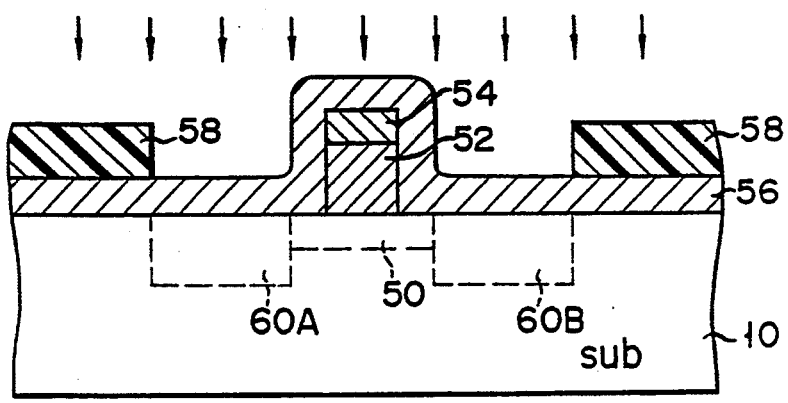
F I G. 5C
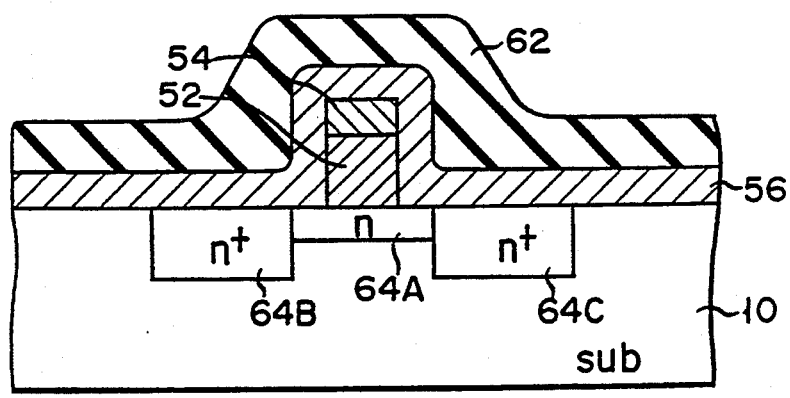
F I G. 5D

METHOD OF MANUFACTURING SCHOTTKY BARRIER GATE TYPE FET

This is a Divisional application under 37 CFR 1.60 of prior application Ser. No. 07/688,711, filed Apr. 23, 1991, now U.S. Pat. No. 5,187,111, which is a Continuation application of abandoned Ser. No. 07/393,820, filed Aug. 15, 1989, which is a Continuation application of abandoned Ser. No. 07/267,734, filed Nov. 3, 1988, which is a Continuation application of abandoned Ser. 06/911,905, filed Sep. 26, 1986.

BACKGROUND OF THE INVENTION

The present invention relates to a method of manufacturing a field-effect transistor, and, in particular, to a method of manufacturing a Schottky barrier gate type field-effect transistor (SB FET) formed on a GaAs semiconductor substrate.

GaAs MES FETs or GaAs SB FETs have excellent high-frequency properties and are generally used as microwave devices. Recently, MES FETs have also been used as elements for GaAs logic ICs. In this application, an improved manufacturing method of MES FETs is needed.

Various methods exist for manufacturing GaAs MES FETs. In a prevalent method, a channel region is formed in a GaAs substrate, a Schottky gate electrode of a refractory metal or a refractory metal compound is formed on the channel region, and $n^+$-type source drain regions are formed by self-alignment technology. In the formation of source and drain regions, n-type impurity is ion-implanted into the GaAs substrate by using the Schottky gate electrode as a mask, and the GaAs substrate is annealed without removing the Schottky gate electrode. The ion-implanted region in the GaAs substrate is activated by way of the annealing process. As examples of ion-implantation processes, a process of directly implanting impurity ions into an exposed semiconductor substrate, and a process of implanting impurity ions through an insulating film into a semiconductor substrate, are known. As examples of annealing processes for the source and drain regions, a cap annealing process and a capless annealing process are known. In the cap annealing method, the GaAs substrate is covered with an insulative protection film of, for example, PSG, AlN, $SiO_2$, or SiN. In the capless annealing method, the GaAs substrate is exposed to an atmosphere of arsine gas ($ASH_3$).

The above conventional methods have the following drawbacks:

(i) When impurity ions are implanted directly into a semiconductor substrate, a channeling phenomenon occurs. This prevents impurity atoms from distributing themselves within a semiconductor substrate as desired. The crystallinity of the semiconductor substrate is degraded in the ion-implantation process. The damaged crystal portion is susceptible to oxidation, contamination, and etching, compared to the other portion. If the surface of the semiconductor substrate continues to remain exposed even after the ion implantation and is subjected to various physical and chemical treatments, that may lead to unsatisfactory Schottky properties and non-uniform channel regions.

(ii) When impurity ions are implanted through an insulating film into a semiconductor substrate, this insulating film serves to protect the surface of the semiconductor substrate in an activation annealing process after the ion implantation. The insulating film must be removed from the surface of the semiconductor substrate before a Schottky gate electrode is formed by deposition. Therefore, satisfactory Schottky properties and uniform channel regions cannot readily be obtained in the produced MES FETs.

(iii) When the cap or capless annealing process is performed in order to form the $n^+$-type source and drain regions, stress-differences appear in the semiconductor substrate due to the thermal expansion coefficient differences between the gate electrode metal and the other material, for example, of the protection film. The stress differences enhance the lateral diffusion of the impurites which are ion-implanted, corresponding to the source and drain regions to be formed. As a result, a short-channel effect occurs and degrades the element characteristics.

SUMMARY OF THE INVENTION

The object of the invention is to provide a method of manufacturing an SB FET, whereby SB FETs having an excellent frequency characteristic can be manufactured, giving a high yield.

Additional objects and advantages of the invention will be set forth in part in the description which follows, and in part will be obvious from the description, or may be learned by practice of the invention. The objects and advantages of the invention may be realized and attained by means of the processes and combinations particularly pointed out in the appended claims.

To achieve the objects and in accordance with the purpose of the invention, as embodied and broadly described herein, the method of manufacturing a Schottky barrier gate type FET of this invention comprises a first step of forming a first film, made of a refractory metal or a refractory metal compound, on and in Schottky contact with a semiconductor substrate, a second step of forming a first ion-implanted region in said semiconductor substrate by an ion-implantation process during which impurity ions pass through said first film, a third step of forming second and third ion-implanted regions in said semiconductor substrate by an ion-implantation process, said second and third ion-implanted regions being adjacent to said first ion-implanted region, a fourth step of forming a channel region, source region, and drain region, by activating said first, second and third ion-implanted regions, and a fifth step of forming a Schottky gate electrode on said channel region, by patterning said first film.

According to another apsect of the present invention, there is provided a method of manufacturing a Schottky barrier gate type FET, which comprises a first step of forming first, second, and third ion-implanted regions in a semiconductor substrate, the first ion-implanted region being positioned between the second and third ion-implanted regions; a second step of forming a first metal film of a refractory metal or refractory metal compound, on that portion of the semiconductor substrate which corresponds to said first ion-implanted region; a third step of forming a second metal film of a refractory metal or a refractory metal compound, on the first metal film, the second metal film serving as a Schottky gate electrode together with the first metal film; a fourth step of forming a third metal film on that portion of the semiconductor substrate which is not masked by the Schottky gate electrode, the third metal film being formed of the same material as the first metal film; a fifth step of forming channel, source, and drain regions by annealing the first, second, and third ion-implanted regions with the first second, and third metal films being used as protection films; and a sixth step of removing the third metal film from the source and drain regions.

In the first aspect, the first metal film is formed on the semiconductor substrate. The first metal film serves as a passing layer when the first ion-implanted region is formed (second step) and also serves as a protective film for the surface of the first ion-implanted region, when the channel region is formed (fifth step).

During the ion implantation of the second step, the first metal film prevents the channeling phenomenon in which impurity ions advance to the deep region of the semiconductor substrate. In addition, the first metal film prevents the semiconductor substrate from being non-uniformly charged with impurity ions. Thus, the uniform ion implantation is not disturbed by the electric field caused by the charge of the substrate. Furthermore, carriers are distributed at high density in the vicinity of the surface of the substrate, so that mutual conductance of SB FETs is increased.

In the second aspect, during the annealing of the fifth step, the first and third metal films help reduce the stress differences between first ion-implanted region and others in the substrate. As a result, the impurity ions in the second and third ion-implanted regions are prevented from laterally diffusing toward the first ion-implanted region. For microminiturization, the desired characteristics are obtained without remarkable short channel effects. The first and third metal films prevent the first, second, and third ion-implanted regions from being oxidized, contaminated, and from reacting with other harmful ions. Therefore, SB FETs having satisfactory characteristics can be obtained.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIGS. 1A to 1K show the steps of manufacturing an SB FET according to a first embodiment of the invention;

FIGS. 5A to 5E show the steps of manufacturing an SB FET according to a fifth embodiment of the invention, wherein an annealing encapsulant is provided in a manner different from that in the first embodiment;

DETAILED DESCRIPTION OF THE PREFERRED EMBODIMENT

Figure 1E:
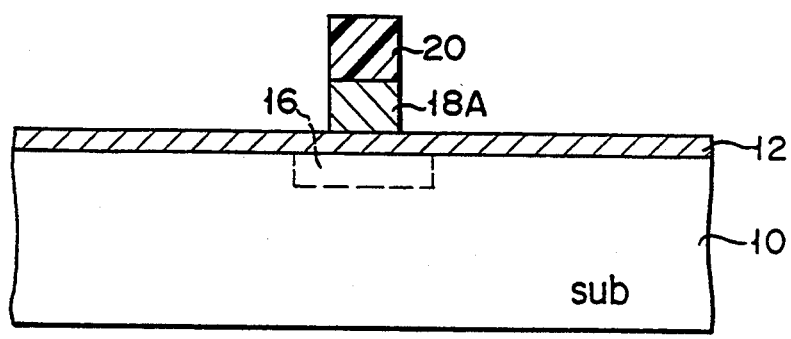

An embodiment of the invention will now be described with reference to FIGS. 1A to 1K, which show the steps of manufacturing the SB FET. In the first step of FIG. 1A, GaAs (gallium-arsenic) semi-insulator substrate 10 is prepared. First metal film 12, is made of, for example, WN (tungsten nitride) or WSi (tungsten silicide). Metal film 12 is formed on substrate 10, by deposition. Metal film 12 has a thickness of 700 Å or less, and covers the entire upper surface of substrate 10. In FIG. 1B, resist pattern 14 is formed on metal film 12. Resist pattern 14 is provided with opening 14A for exposing a portion of metal film 12. Thereafter, using resist pattern 14 as a mask, an ion-implantation process is performed. Through metal film 12, n-type impurities are ion-implanted into substrate 10, thereby forming ion-implanted region 16, as is shown in FIG. 1C. Resist pattern 14 is then removed.

Second metal film 18 shown in FIG. 1C is made of, for example, Mo (molybdenum), and is formed on metal film 12. Metal film 18 has a thickness more than 500 Å, and covers entire surface of metal film 12.

In FIG. 1D, resist pattern 20 is formed on metal film 18. With resist pattern 20 being used as a mask, metal film 18 is then etched. As is shown in FIG. 1E, a portion of metal film 18 constitutes upper Schottky gate electrode 18A. Thereafter, resist pattern 20 is removed.

Figure 1F:
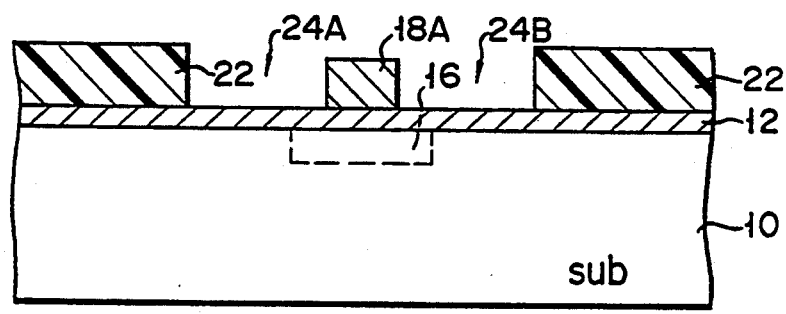
Figure 1G:
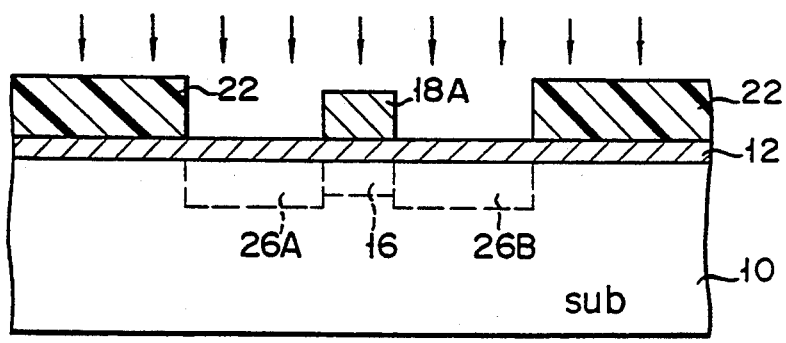
Figure 1H:
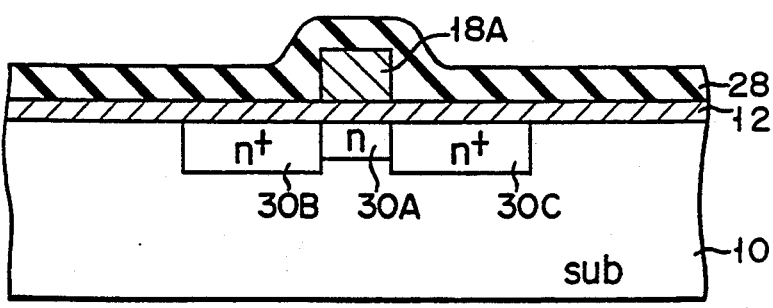

In FIG. 1F, a resist is coated on the entirety of metal film 12 and gate electrode 18A, to form a resist film (not shown). This resist film is subjected to a patterning process and is left as a resist pattern 22. As a result, metal film 12 is partly exposed at openings 24A and 24B on both sides of gate electrode 18A. Then, resist pattern 22 and gate electrode 18A are used as masks, and an ion-implantation process is performed. Through metal film 12, n+-type impurities are ion-implanted into substrate 10, as is shown in FIG. 1G. Thus, n+-type ion-implanted regions 26A and 26B are formed, having a higher impurity concentration than ion-implanted region 16. Resist pattern 22 is removed after the ion-implantation. In FIG. 1H, insulation film 28 is formed on the entirety of gate electrode 18A and metal film 12. The semiconductor structure thus formed is subjected to an annealing process at a temperature of about 700°–1000° C. for the period less than an hour, in order to activate ion-implanted regions 16, 26A, and 26B and to recover the crystallinity. Ion-implanted regions 16, 26A, and 26B respectively form n-type channel region 30A, n+-type source region 30B, and n+-type drain region 30C, following the annealing process. Insulation film 28 protects metal film 12 and upper gate electrode 18A during the annealing process. Thereafter, insulation film 28 is removed.

Metal film 12 is subjected to a reactive-ion etching, using gate electrode 18A as a mask. Through this etching process, gate electrode 12A is formed under and in contact with gate electrode 18A, by self-alignment, as is shown in FIG. 1J. The semiconductor structure thus formed is entirely covered with an insulation film (not shown) and a resist pattern (not shown) formed on the insulation film. The resist pattern exposes those portions of the insulating film which are located above source and drain regions 30B and 30C. The exposed portions of the insulating film are removed from source and drain regions 30B and 30C. A third metal film (not shown), made of, for example, AuGe, Ni, or Au, is deposited on the resist pattern and on source and drain regions 30B and 30C. The resist pattern is removed together with unnecessary portions of the third metal film, by lift-off. The remaining portions of the third metal film are subjected to an alloy process, thereby serving as source electrode 32A and drain electrode 32B in ohmic contact with source region 30B and drain region 30C. The SB FET is thus formed.

In the first embodiment, the entire upper surface of GaAs substrate 12 is covered with first metal film 12 formed in the step of FIG. 1A. Impurities are ion-implanted into GaAs substrate 10, in the step of FIG. 1B, after the step of FIG. 1A, so as to form ion-implanted region 16. Though first metal film 12 is selectively etched to leave a part of it as gate electrode 12A, in the step of FIG. 1J, gate electrode 12A is not removed from ion-implanted region 16 throughout all the manufacturing steps. Gate electrode 12A constantly protects ion-implanted region 16 against oxidation, etching, and contamination. Since the annealing process for activating ion-implanted region 16 is performed in this state, fluctuations in the SB FET characteristics and Schottky characteristics are decreased sufficiently, and a stable operation is ensured, by means of the satisfactory channel region 30A obtained via the annealing process.

In the first embodiment, impurities are ion-implanted through first metal film into GaAs substrate 10, in the step of FIG. 1B. The impurity ions do not directly impinge upon the surface of substrate 10; thus, the surface of substrate 10 is protected.

First metal film 12 suppresses the channeling phenomenon in which impurity ions are implanted into substrate 10, beyond the desired depth.

First metal film 12 prevents the charging of substrate 10. Generally, GaAs has a high insulation property. Once GaAs substrate is charged, the electric charge is not easily removed.

In the case wherein a plurality of SB FETs are formed in a GaAs wafer, an electric field, which is caused by the non-uniform distribution of the charge stored in the wafer, may prevent uniform ion implantation of impurity ions. However, when metal film 12 is, as in the first embodiment, formed to cover the surface of the substrate, impurity ions are uniformly implanted into the GaAs wafer, so that fluctuation in the characteristics of the SB FETs is decreased.

Since the carrier density in the vicinity of the surface of substrate 10 can be set, by ion implantation, to a higher value than the case in which metal film 12 is not provided, an SB FET having a high mutual conductance can be obtained.

In the first embodiment, the gate electrode of the SB FET is constituted by upper gate electrode 18A and lower gate electrode 12A. Lower gate electrode 12A is made thin, so that impurity ions can permeate into the ion-implantation steps of FIGS. 1B and 1G. On the other hand, electrode 18A can be freely thickened. In this case, parasitic resistance of the gate electrode can be greatly decreased, and an SB FET operable in a high frequency range can be obtained.

In the first embodiment, resist pattern 20 is formed on metal film 18. It is, however, possible to constitute pattern 20 by an insulation material such as $SiO_2$ or a composite layer of insulator and resist.

In the step of FIG. 1H, an annealing process using insulation film 28 as a protective or encapsulant layer, a capless annealing process in an arsine gas ($AsH_3$) atmosphere, or a lamp annealing process, may be adopted.

In the step of FIG. 1A, WN is used as the material of first metal film 12. For example, a single substance of tungsten can alternatively be used.

In the step of FIG. 1C, second metal film 18 of Mo is formed. Molybdenum may be replaced by an Mo compound. In other words, first and second metal films 12 and 18 are formed of a refractory metal or a refractory metal compound.

In the step of FIG. 1J, gate electrode 12A is formed by subjecting metal film 12 to reactive ion etching. However, the reactive ion etching may be conducted in the step of FIG. 1F or FIG. 1H.

The second embodiment will now be described with reference to FIGS. 2A to 2C. The second embodiment is identical to the first embodiment, except for the steps of FIGS. 2A to 2C. In FIGS. 2A to 2C, the same elements as those shown in FIGS. 1A to 1K are indicated by the same reference numerals.

In the second embodiment, after the step of FIG. 1E of the first embodiment, resist pattern 20 is removed, and, as is shown in FIG. 2A, oxidized film 34 is formed by deposition. Oxidized film 34 is subjected to an etch-back process, in which portions of oxidized film 34 are left on the sides of gate electrode 18A as side walls 38, as is shown in FIG. 2B. Thereafter, resist pattern 22, shown in FIG. 2C, is formed on metal film 12. Then, an ion-implantation process is performed by using resist pattern 22, side walls 38, and gate electrode 18A as masks. In this process, n-type impurity ions are implanted into substrate 10 through an exposed portion of metal film 12, thereby forming $n^+$-type ion-implanted regions 26A and 26B, as is shown in FIG. 2C. Side wall 38 prevents the passage of the impurity ions, and provides off-set interval L between the gate electrode and ion-implanted regions 26A and 26B. An SB FET of the second embodiment is provided by way of the same steps as those of FIGS. 1H to 1K, after the step of FIG. 2C.

In the second embodiment, channel region 30A is provided having a long length, so that source and drain regions 30B and 30C are separated from multi-layered gate electrodes 18A and 12A. Therefore, multi-layered gate electrodes 18A and 12A can hardly be placed in direct contact with source and drain regions 30B and 30C. In the case in which the gate electrode is placed in direct contact with source and drain regions 30B and 30C, the SB FET does not operate as a transistor.

Figure 3:
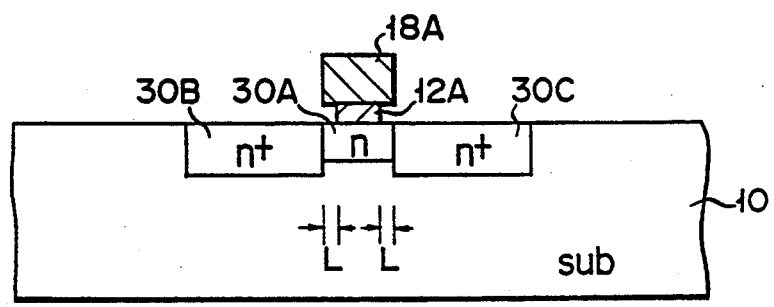
FIG. 3 shows a step of manufacturing an SB FET according to a third embodiment of the invention, wherein the first metal film is side-etched by plasma etching in order to prevent a leakage current from flowing between from flowing between the gate and source, and between the gate and drain.

FIG. 3 shows the third embodiment in which the offset interval L is provided differently from the second embodiment. Except for this point, the third embodiment is identical to the first. In the third embodiment, the same elements as those in the first embodiment are indicated by the same reference numerals.

Figure 1I:
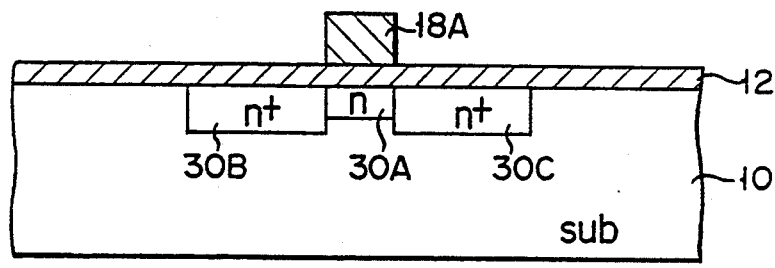
Figure 1J:
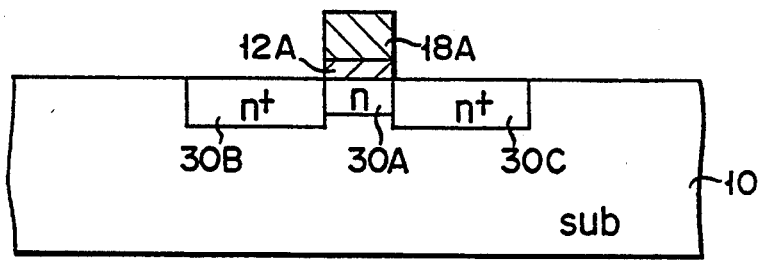
Figure 1K:
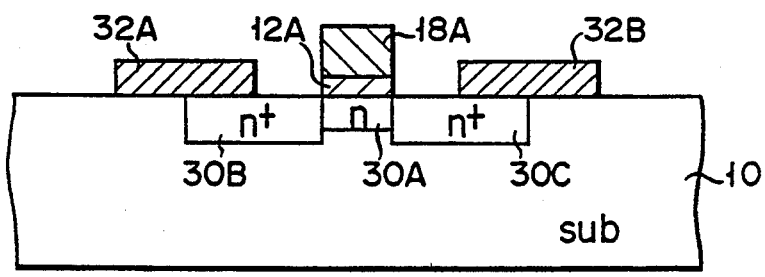
Figure 2A:
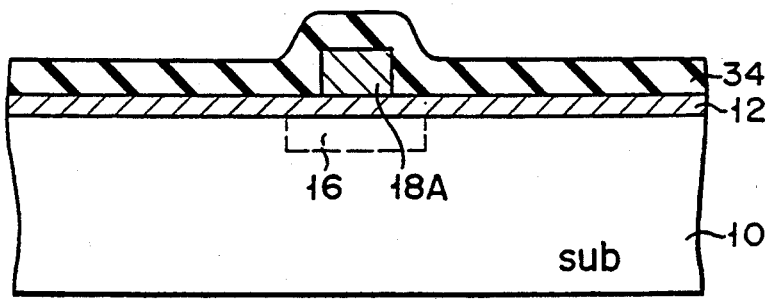
FIGS. 2A to 2C show the steps of manufacturing an SB FET according to a second embodiment of the invention, wherein side walls are provided in order to prevent a leakage current from flowing between the gate and source, and between the gate and drain.
Figure 2B:
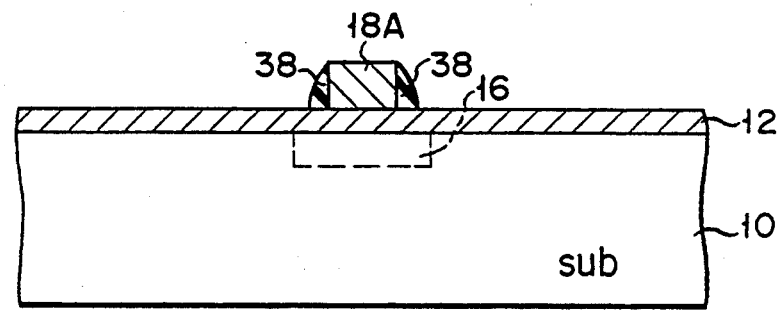
Figure 2C:
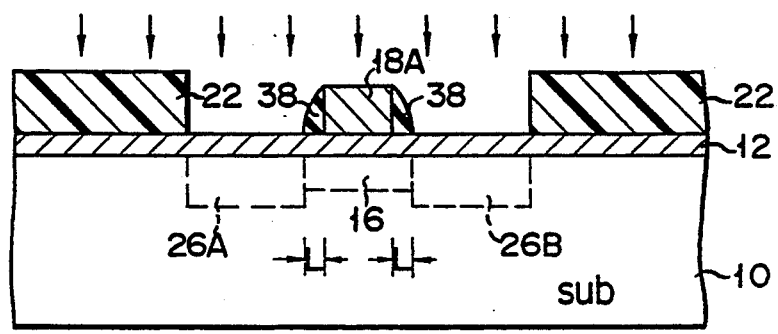

In the third embodiment, a portion of metal film 12 is removed by reactive ion etching and plasma etching after the step of FIG. 1I, thus forming lower gate electrode 12A, shown in FIG. 3. In the plasma etching process, metal film 12 is etched in the horizontal direction, so that gate electrode 12A can be shorter than gate electrode 18A. Source and drain regions 30B and 30C cannot directly contact multi-layered gate electrode 18A and 12A, due to the off-set interval. Therefore, a leakage current hardly flows between the gate electrode 12A and each of the source and drain regions 30B and 30C.

Figure 4:
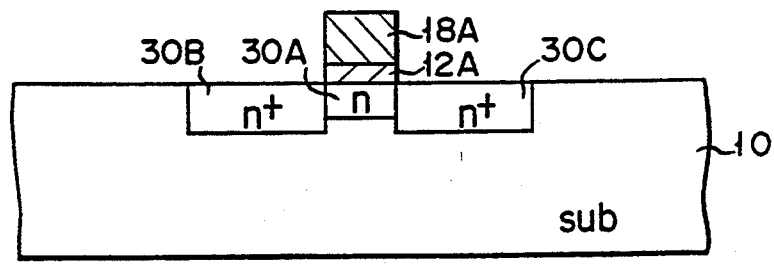
FIG. 4 shows a step of manufacturing an SB FET according to a fourth embodiment of the invention, wherein the source and drain regions are formed by capless annealing.

FIG. 4 shows the fourth embodiment which is identical to the first embodiment, except for the etching and activation annealing processes.

In the fourth embodiment, metal film 12 is also etched with resist pattern 20 being used as mask, after the step of FIG. 1D. The remaining portion of metal film 12 serves as gate electrode 12A. Resist pattern 20 is removed after the formation of gate electrode 12A. Thereafter, resist pattern 22 is formed directly on substrate 10 and is used as the mask for the ion-implantation process of FIG. 1G. After the step of FIG. 1G, the entire semiconductor structure is subjected to a capless annealing process in an arsine gas atmosphere. Although ion-implanted regions 26A and 26B are exposed to arsine gas, ion-implanted region 16 is covered with gate electrode 18A and 12A.

In the fourth embodiment, an annealing process different from that of the first embodiment is performed. However, the effects described in the first embodiment can also be obtained in the fourth embodiment. In the fourth embodiment, ion-implanted regions 26A and 26B are exposed to arsine gas. However, regions 26A and 26B may be covered with an insulative protection film.

The first embodiment can also bring about the following effect which cannot be obtained from the fourth embodiment. In the first embodiment, metal film 12 covers substrate 10 during the ion implantation and annealing process for forming the n+-type source and drain regions 30B and 30C. Thus, ion-implanted impurities, at a high concentration, are distributed in the vicinity of the surface of the substrate. This reduces the contact resistances of the source and drain electrodes. Further, metal film 12 is formed on the entire surface of substrate 10. In other words, ion-implanted region 16 is covered with the same material as ion-implanted regions 26A and 26B. During the annealing process of FIG. 1G, this reduces the stress differences in substrate 10 at the positions between regions 16 and 26A and between regions 16 and 26B, and prevents the lateral diffusion of impurity ions from regions 26A and 26B to region 16. Therefore, an SB FET, whose short channel effect is small, is obtained.

Figure 5E:
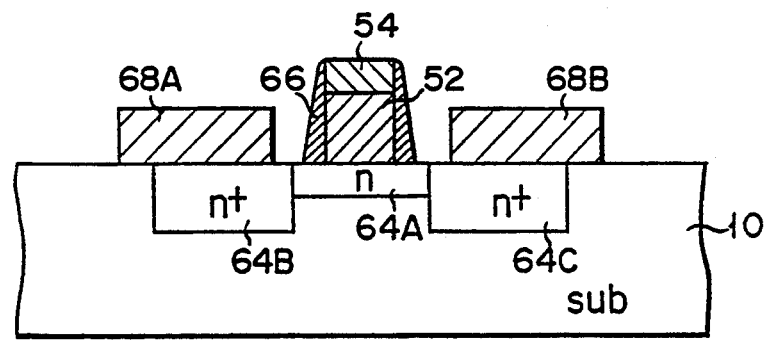

FIGS. 5A to 5E shows the fifth embodiment of the invention. In the step of FIG. 5A, ion-implanted region 50 is formed in the surface area of GaAs semi-insulator substrate 10, by ion implantation of an n-type impurity. First metal film 52 and second metal film 54, which are made of a refractory metal or its compound, constitute a Schottky gate electrode. First metal film 52 is formed on ion-implanted region 50, and second metal film 54 is formed on first metal film 52. For example, when first metal film 52 is made of WNx (tungsten nitride), second metal film 54 is made of a material having a reactive ion etching (RIE) rate which is sufficiently different from that of WNx. That is, second metal film 54 is made of, for example, Mo (molybdenum). The thickness of first metal film 52 is set to about 1000 Å, and that of second metal film 54 is set to about 300 Å.

In the step of FIG. 5B, third metal film 56 is formed so as to cover substrate 10, ion-implanted region 50, and first and second metal films 52 and 54.

The third metal film 56 is made of WNx, which is the material of first metal film 52. Third metal film 56 is set to a thickness close to that of first metal film 52, within the range from 100 to 2000 Å.

After the formation of metal film 56, resist pattern 58 is formed on third metal film 58, as is shown in FIG. 5C. N-type impurity ions are implanted into substrate 10 by using resist pattern 58 and the portion of third metal film on the gate electrode, as masks. Ion-implanted regions 60A and 60B are thus formed in a self-aligning manner. The impurity concentration in ion-implanted regions 60A and 60B is higher than that in ion-implanted region 50. After ion-implanted regions 60A and 60B are formed, resist pattern 58 is removed. Instead, insulation film 62 of, for example, PSG film, is entirely formed on third metal film 56, as is shown in FIG. 5D. Ion-implanted regions 50, 60A, and 60B are then annealed to form channel region 64A, source region 64B, and drain region 64C. The annealing process is conducted for 30 minutes at a temperature of 800° C., using an inert gas such arsine, N$_2$, or Ar gas. After the annealing, insulation film 62 is removed from third metal film 56.

In FIG. 5E, third metal film 56 is subjected to reactive ion etching (RIE) in a direction vertical to substrate 10, and is removed from source and drain regions 64B and 64C. In the RIE process, portions 66 of third metal film 56 are left on the side surfaces of first and second films 52 and 54. Source electrode 68A and drain electrode 68B are formed in ohmic contact with source region 64B and drain region 64C. An SB FET is thus formed.

In the fifth embodiment, first and third metal films 52 and 56 of a tungsten-based compound (e.g., WNx) are formed, as annealing-protection film on ion-implanted regions 50, 60A, and 60B. The atoms constituting first and second metal films 52 and 56 do not easily diffuse into GaAs ion-implanted regions 50, 60A, and 60B during the annealing process. Therefore, the electrical resistance of n+-type source and drain regions 64B and 64C can be sufficiently decreased. In addition, since first metal film 52 and third metal film 56 are made of the same material, stress is not concentrated in one area of substrate 10 during the annealing process, and the impurities are not abnormally diffused in substrate 10. A refractory metal such as tungsten, which produces first and third films 52 and 56, has much the same thermal expansion coefficient as GaAs. The surface of substrate 10 is covered by first and third metal films 52 and 56, so that cracking, which may be caused in the surface of substrate 10 due to different thermal expansion coefficients, can be prevented. Such cracking may likely be produced in the case wherein an annealing protection film is formed only on a portion of substrate 10, for example, in ion-implanted region 50, or where a protection film is formed having a thermal expansion coefficient different from that of substrate 10.

In FIG. 5C, impurities are ion-implanted through third metal film 56 into substrate 10. Therefore, the same effect as is brought about in the aforementioned embodiments can be achieved; namely, the short-channel effect, which is aggravated as the gate length is shortened, can be curbed.

As is described above, the SB FET thus manufactured has an excellent drain conductance and a uniformity in the various characteristics which depend on the state of the surface of substrate 10.

Figure 6:
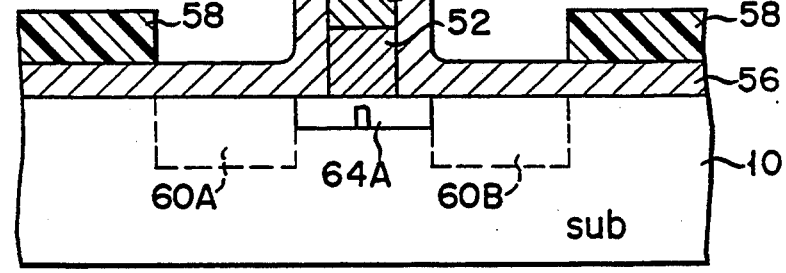
FIG. 6 shows a step of manufacturing an SB FET according to a sixth embodiment of the invention, which is identical with the fifth embodiment, except for the fact that there is provided a separate step of annealing the ion-implanted region corresponding to the channel region.

In the fifth embodiment, ion-implanted regions 50, 60A, and 60B are simultaneously annealed. However, it is possible to anneal only ion-implanted region 50, before the ion implantation process in the step of FIG. 5C. In this case, ion-implanted regions 60A and 60B are formed, as shown in FIG. 6.

Figure 7:
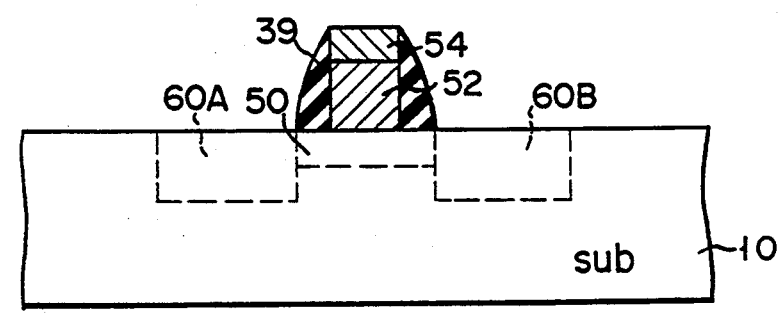
FIG. 7 shows a step of manufacturing an SB FET according to a seventh embodiment of the invention, which is identical with the fifth embodiment, except for the fact that the ion-implanted region corresponding to the source and drain regions is formed before the annealing encapsulant is formed.

In the fifth embodiment, as shown in FIGS. 5B and 5C, ion-implanted regions 60A and 60B are formed after third metal film 56 is formed. However, it is possible to form ion-implanted regions 60A and 60B with metal films 52 and 54 and side walls 39 as masks, before third metal film 56 is formed, as is shown in FIG. 7. In this case, the same effect as is achieved in the fifth embodiment can be brought about in the annealing process.

Figure 8:
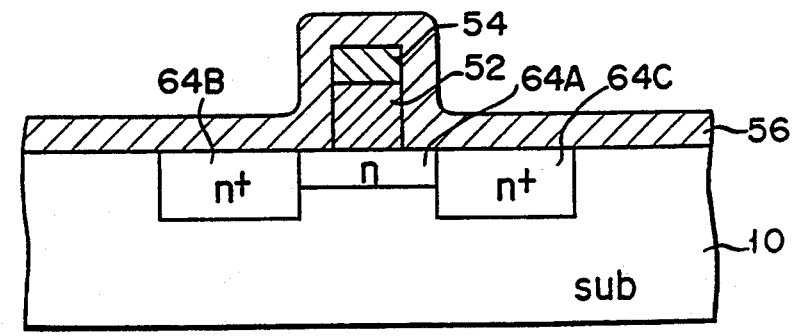
FIG. 8 shows a step of manufacturing an SB FET according to an eighth embodiment of the invention, which is identical with the fifth embodiment, except for the fact that the source and drain regions are formed by capless annealing.

In the fifth embodiment, as shown in FIG. 5D, insulation film 62 is formed on third metal film 56. Insulation film 62 may, however, be dispensed with, as is shown in FIG. 8, and the annealing process may be performed without it.

The experimental result with regard to the characteristics of the SB FET wherein first and second metal films 52 and 56 are used as an annealing protection film, will now be described with reference to FIGS. 9 to 11.

Figure 9:
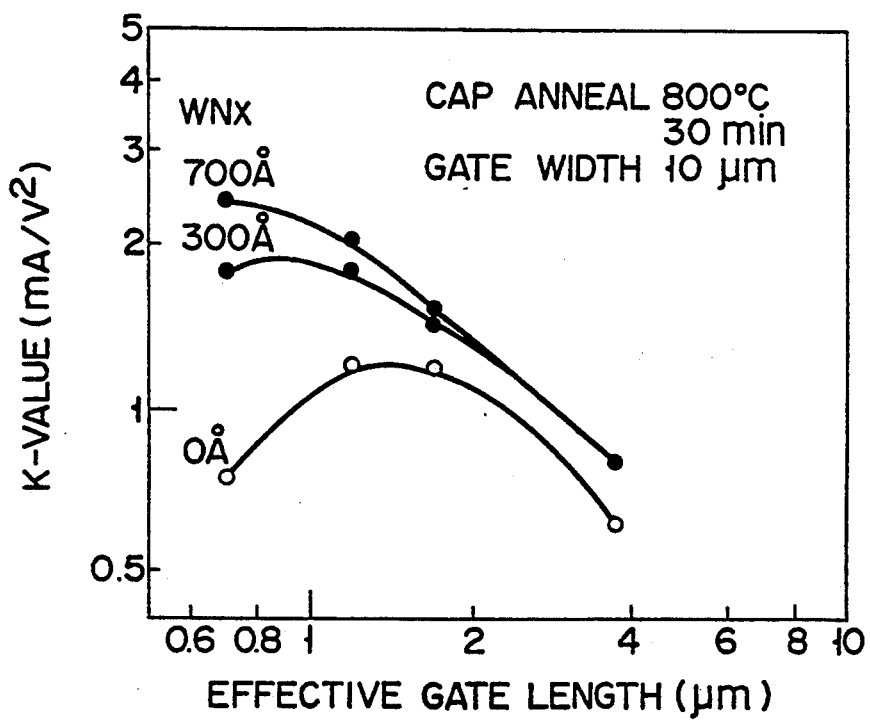
FIGS. 9–11 show the characteristics of the SB FET formed by the steps in the seventh embodiment.

FIG. 9 shows gate-length dependence of the K-value for the FET with the 10 μm gate width. When the WNx film thickness is 300 Å, the K-value increases with decreasing gate length Lg and reaches 1.8 mA/V² when Lg=1.2 μm. It has almost same value when Lg=0.7 μm. On the other hand, the K-value continues to increase to become 2.4 mA/V2 when Lg=0.7 μm, when the WNx film thickness is 700 Å, which has not been observed in any other cap annealing process such as annealing using only PSG cap film. It can therefore be said that usage of WNx film as a cap material contacting the GaAs surface, contributes to the K-value enhancement in the submicron gate length region. It is also the case with the long-channel FETs (Lg=1.7 μm), and a 30% improvement can be achieved by using the WNx cap annealing process. One of the reasons for this might be that the WNx film prevents the reaction of oxygen in PSG film with GaAs, thus resulting in less Ga out-diffusion.

Figure 10:
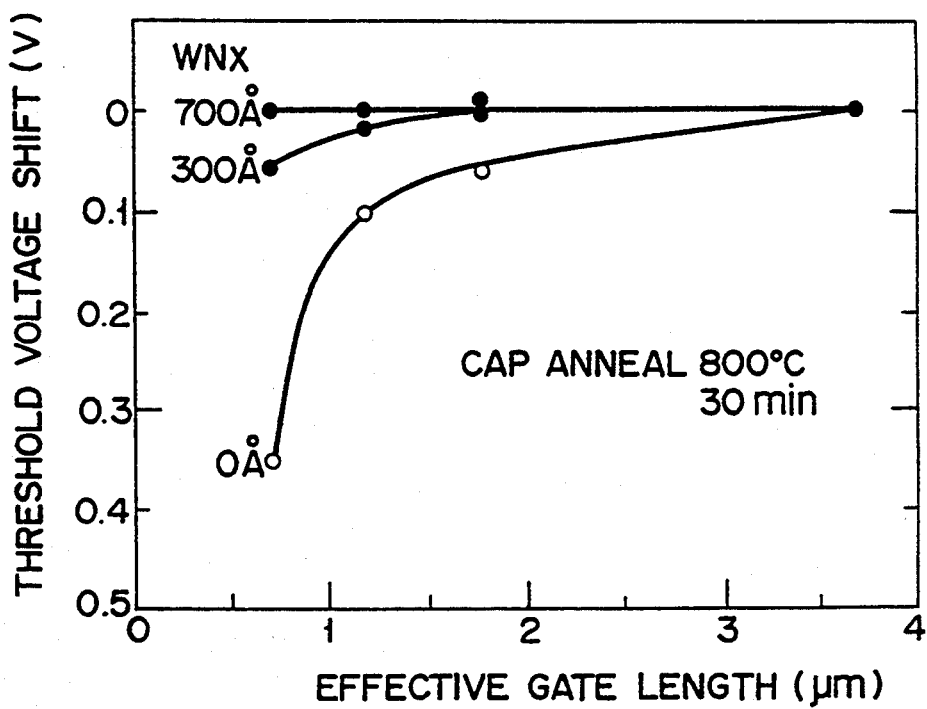
Figure 11:
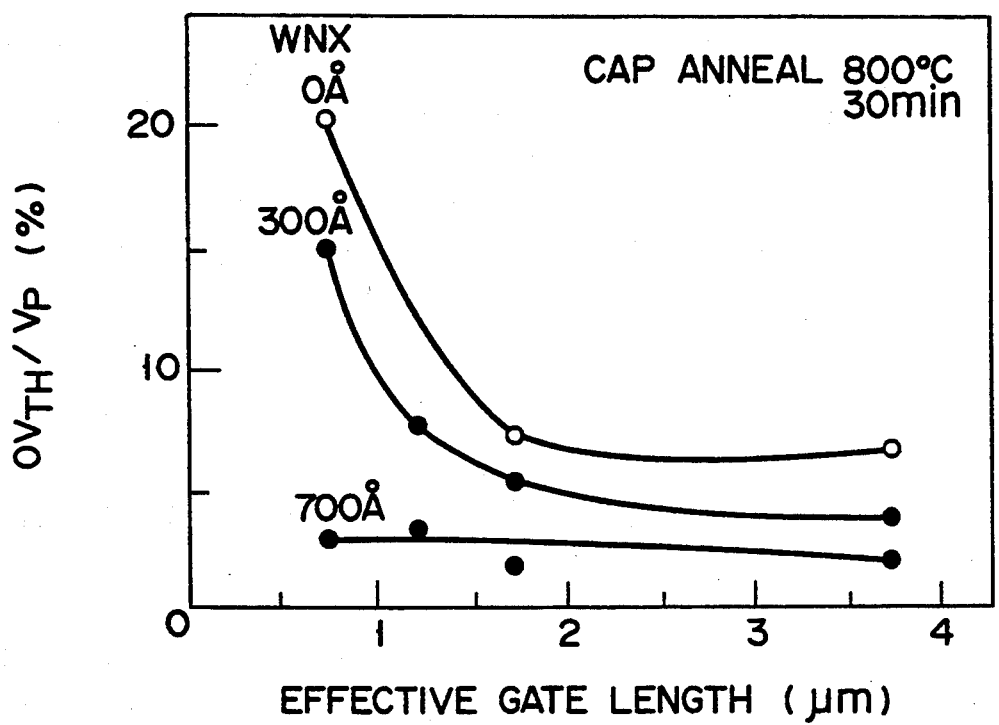

FIGS. 10 and 11 show the gate length dependencies of the threshold voltage and the standard deviation, respectively. In FIG. 10, the following is found: Without the WNx encapsulant, the Vth difference between the long gate FET (Lg=3.7 μm) and the short gate FET (Lg=0.7 μm), is −350 mV. With a 300 Å WNx encapsulant, the Vth is only −50 mV, and with a 700 Å WNx encapsulant, no difference is observed. Therefore, we can reduce the Vth shift in the submicron gate region substantially by using 700 Å-thick WNx as an encapsulant film. It is possible to make the Vth shift zero for even Lg=0.7 μm. K-value reduction can be also avoided by using a 700 Å-thick WNx cap film. The annealing performance with 700 Å WNx film is better than that with 300 Å. In FIG. 11, we can see that the standard deviation of Vth is also smaller with the WNx cap than that without WNx. The reason for this is thought to be that since the gate length dependence of Vth was reduced, the fluctuation of the gate length, due to the inaccurate lithography, does not have so much influence on the Vth fluctuation.

The short-channel effects, which are characterized by the K-value lowering and Vth shift, are suppressed by WNx cap annealing. The distinctive feature of this technique is due to the homogeneous interface between the GaAs surface and the above-deposited material along the entire FET region, that is, no local stress appears near the gate, especially the peripheral region, which can prevent the lateral diffusion of implanted species from the n+-region to the channel region. As a result, the desired impurity profile can be realized in an FET, which leads to the suppression of short-channel effects.

In the present invention, the surface of the channel region is neither contaminated nor deteriorated after the ion-implantation process. Therefore, fluctuations in the characteristics of manufactured FETs can be fully suppressed. The annealing encapsulant provides a uniform threshold voltage and an increased drain conductance. In addition, the sheet resistance of the gate electrode is lowered, and a high mutual conductance can be obtained. The SB FET has excellent frequency characteristics.

What is claimed is:

1. A method of manufacturing a Schottky barrier gate type FET comprising:
    a first step of forming a first film made of a refractory metal or a refractory metal compound, on a semiconductor substrate;
    a second step of forming a first ion-implanted region in said semiconductor substrate by an ion-implantation process during which impurity ions pass through said first film;
    a third step, independent of said second step, of forming second and third ion-implanted regions in said semiconductor substrate by an ion-implantation process during which impurity ions pass through said first film, said second and third ion-implanted regions being adjacent to said first ion-implanted region;
    a fourth step of forming a channel region, source region, and drain region, by annealing to activate said first, second, and third ion-implanted regions using said first film as a protective film, and bringing said first film in Schottky contact with said channel region;
    a fifth step of forming a Schottky gate electrode, in Schottky contact with said channel region, by patterning said first film after said channel, source, and drain regions have been formed, with said first film being selectively maintained to prevent exposure of the channel region underlying the Schottky gate electrode; and
    a sixth step of forming a second film made of a refractory metal or a refractory metal compound, on the first film forming a portion of said Schottky gate electrode.

2. A method according to claim 1, wherein said fourth step includes a substep of simultaneously annealing said first, second, and third ion-implanted regions, said first film being used as a protective film.

3. A method according to claim 2, wherein
    said first step includes a substep of forming said first film on the entire surface of said semiconductor substrate;

said sixth step includes a substep of forming said second film above a central portion of the first ion-implanted region; and said third step includes a substep of forming a side wall on side surfaces of the second film, and a substep of forming said second and third ion-implanted regions by implanting impurity ions into said semiconductor substrate, with said second film and said side wall being used as a mask.

4. A method according to claim 3, wherein said second film forming substep includes a substep of forming said second film on the entire surface of the first film, and a substep of selectively etching the second film to leave a portion of the second film above said central portion of the first ion-implanted region; and said side wall forming substep includes a substep of forming an insulation layer which covers the remaining second film and an exposed portion of the first film, and a substep of etching back said insulation layer to leave a portion of the insulation layer on the side surfaces of said second film as said side wall.

5. A method according to claim 2, wherein said first step includes a substep of forming said first film on the entire surface of the semiconductor substrate; and said sixth step includes a substep of forming said second film above a central portion of said first ion-implanted region, and a substep of side-etching the first film by using said second film as a mask.

6. A method according to claim 1, wherein said semiconductor substrate is formed of gallium arsenide (GaAs), the channel region, source region, and drain region include an n-type impurity, and said source and drain regions have an impurity density higher than that of the channel region.

7. A method according to claim 6, wherein said first film is made of tungsten nitride or tungsten silicide.

8. A method of manufacturing a Schottky barrier gate type FET, comprising:

a first step of forming first, second, and third ion-implanted regions in a semiconductor substrate, said first ion-implanted region being positioned between said second and third ion-implanted regions;

a second step of forming a first film of a refractory metal or a refractory metal compound, on that portion of said semiconductor substrate which corresponds to said first ion-implanted region;

a third step of forming a second film of refractory metal or a refractory metal compound, on said first film, said second film serving as a Schottky gate electrode, together with said first film;

a fourth step of forming a third film on that portion of said semiconductor substrate which is not masked by said Schottky gate electrode, said third film being formed of the same material as said first film;

a fifth step of forming channel, source, and drain regions by annealing said first, second, and third ion-implanted regions, with said first and third films being used as protective films; and a sixth step of removing said third film from said source and drain regions.

9. A method according to claim 8, wherein said third step includes a substep of forming the second film having a slower etching rate than said first film, said fourth step includes a substep of forming the third film covering the entire Schottky gate electrode and that portion of said semiconductor substrate which is not masked by said Schottky gate electrode, and said sixth step includes a substep of isotropically etching said third film.

10. A method according to claim 8, wherein said first step includes a substep of implanting impurity ions into said semiconductor substrate, through said third film to form the second and third ion-implanted regions.

11. A method according to claim 10, wherein said Schottky gate electrode and a portion of said third film covering the Schottky gate electrode are used as a mask in the implanting substep.

12. A method according to claim 8, wherein said first step includes a substep of implanting impurity ions into said semiconductor substrate, to form said second and third ion-implanted regions, with said Schottky gate electrode and a portion of said third film covering the Schottky gate electrode being used as a mask.

13. A method according to claim 8, wherein said second step includes a substep of forming the first film on the entire surface of said semiconductor substrate and a substep of patterning the first film to leave that portion of said first film which is located on that portion of said semiconductor substrate which corresponds to said channel region and spaced apart from those portions of said semiconductor substrate which correspond to said source and drain regions.

14. A method according to claim 8, wherein said first step includes a substep of forming said first ion-implanted region by implanting impurity ions into said semiconductor substrate, a substep of forming a side wall on side surfaces of said Schottky gate electrode and over said first ion-implanted region, and a substep of forming said second and third ion-implanted regions by implanting impurity ions into said semiconductor substrate, with said Schottky gate electrode and side wall being used as a mask.

* * * * *